United States Patent [19]

Powell

[11] Patent Number: 5,583,318
[45] Date of Patent: Dec. 10, 1996

[54] MULTI-LAYER SHIELD FOR ABSORPTION OF ELECTROMAGNETIC ENERGY

[75] Inventor: Thomas A. Powell, Morristown, N.J.

[73] Assignee: Lucent Technologies Inc., Murray Hill, N.J.

[21] Appl. No.: 176,566

[22] Filed: Dec. 30, 1993

[51] Int. Cl.[6] ........................................ H05K 9/00
[52] U.S. Cl. ........................ 174/35 MS; 174/35 R; 250/515.1
[58] Field of Search ............... 175/35 R, 35 GL, 175/35 MS; 478/34, 328; 250/515.1, 518.1

[56] References Cited

U.S. PATENT DOCUMENTS

| | | | |
|---|---|---|---|
| 2,870,439 | 1/1959 | Stinehelfer | 343/18 |
| 2,875,435 | 2/1959 | McMillan | 343/18 |
| 2,977,591 | 3/1961 | Tanner | 343/18 |
| 3,114,839 | 12/1963 | Peters | 250/108 |
| 3,836,967 | 9/1974 | Wright | 343/18 A |
| 4,012,738 | 3/1977 | Wright | 343/18 A |
| 4,164,718 | 8/1979 | Iwasaki | 343/18 A |
| 4,371,742 | 2/1983 | Manly | 174/36 |
| 4,396,643 | 8/1983 | Kuehn et al. | 427/160 |
| 4,496,950 | 1/1985 | Hemming et al. | 343/18 A |
| 4,825,090 | 4/1989 | Grabis | 250/515.1 |
| 4,889,750 | 12/1989 | Wiley | 428/34.2 |
| 4,931,798 | 6/1990 | Kogo | 342/4 |
| 4,948,922 | 8/1990 | Varadan et al. | 174/35 GC |
| 4,973,963 | 11/1990 | Kurosawa et al. | 342/4 |
| 5,039,825 | 8/1991 | Samarov | 174/35 GL |
| 5,081,455 | 1/1992 | Inui et al. | 342/1 |
| 5,146,047 | 9/1992 | Nagata et al. | 174/35 MS |
| 5,147,694 | 9/1992 | Clarke | 428/34 |
| 5,208,599 | 5/1993 | Ridduck et al. | 342/4 |
| 5,260,128 | 11/1993 | Ishii et al. | 174/35 MS X |
| 5,260,513 | 11/1993 | Giles et al. | 174/35 MS |

OTHER PUBLICATIONS

Paul A. Chatterton et al., *EMC–Electromagnetic Theory to Practical Design*, John Wiley & Sons, West Sussex, England, pp. 73–97, 1992.

*Primary Examiner*—Kristine L. Kincaid
*Assistant Examiner*—Christopher Horgan

[57] ABSTRACT

A multi-layer structure for shielding electromagnetic energy in a data processing equipment enclosure. The multi-layer structure includes a first layer formed of a first material having a first set of electromagnetic properties and a textured surface and at least one further layer stacked behind the first layer and formed of at least one further material having a second set of electromagnetic properties, the second set of electromagnetic properties being different than the first set. The first and further layer are configured to absorb the electromagnetic energy and dissipate the energy as heat within the multi-layer structure.

12 Claims, 3 Drawing Sheets

MULTI-LAYER SHIELD FOR ABSORPTION OF ELECTROMAGNETIC ENERGY

BACKGROUND OF THE INVENTION

1. Field of the Invention

The invention generally relates to electromagnetic shields, and more particularly, to a multi-layer shield for absorbing and dissipating electromagnetic energy within dam processing equipment and the like.

2. Related Art

Most countries have international standards that set an acceptable limit for spurious transmission of electromagnetic (EM) energy from data processing equipment, such as radio transmitters and the like. These standards vary from country to country. The European standard for instance, is much more stringent than the American standard. Thus, a goal of transmitter manufactures is to produce electromagnetically "quiet" devices that exceed domestic standards so that their devices can be marketed abroad.

Conventional transmitter EM shielding typically reflects some amount of the energy back towards the source. For example, a radio frequency (RF) transmitter having a housing, an oscillator and amplifier circuit located in the housing, generates RF power for transmission of signals. EM energy is radiated at a certain wavelength within the housing. These waves usually encounter a shield either located around the oscillator and amplifier circuit or adjacent the inner surface of the housing. The shield grounds some of the energy and reflects some of the energy back towards the source. The reflected energy can cause standing wave patterns within the housing causing phase and/or amplitude interference with the source and degradation in RF performance, particularly, power output and inner-modulation distortion.

What is desired is an EM shield that absorbs spurious transmissions within the transmitter housing, or the like, and substantially prevents EM energy from being reflected back to the source.

SUMMARY OF THE INVENTION

The present invention is directed to a multi-layer structure and method for absorbing spurious electromagnetic energy of a particular frequency or range of frequencies in data processing equipment. The multi-layer structure has a plurality of layers formed of diverse materials having diverse electromagnetic properties selected to absorb the spurious electromagnetic energy and dissipate the energy as heat within the multi-layer structure.

In the preferred embodiment, the first layer is textured to minimize angular reflections of the energy at one or more wavelengths. Alternatively, the stacked layers are formed with a corrugated cross-section.

A feature of the multi-layer shielding is the ability to absorb and dissipate EM energy to reduce or eliminate spurious transmission from RF equipment, such as transmitters and the like. By absorbing and dissipating energy within the multi-layer shielding, the efficiency of a transmitter can be increased.

The present invention is applicable where it is desirable to contain or divert EM energy. For example, RF transmitter shielding, frame shielding, sub-system isolation, and the like.

The foregoing and other features and advantages of the present invention will be apparent from the following more particular description of the preferred embodiments of the invention, as illustrated in the accompanying figures.

BRIEF DESCRIPTION OF THE FIGURES

The invention will be better understood if reference is made to the accompanying figures in which.

DETAILED DESCRIPTION OF THE PREFERRED EMBODIMENT

The preferred embodiment of the present invention is discussed in detail below. While specific steps, configurations and arrangements are discussed, it should be understood that this is done for illustration purposes only. A person skilled in the relevant art will recognize that other steps, configurations and arrangements may be used without departing from the spirit and scope of the invention.

The preferred embodiment of the invention is now described with reference to the figures where like reference numbers indicate identical or functionally similar features. Also in the figures, the left-most digit of each reference number corresponds to the figure in which the reference number is first used.

The present invention is a multi-layer structure for mounting within an enclosure, such as a transmitter chassis, or the like. The multi-layer structure is designed to substantially reduce spurious transmissions from a source within the data processing equipment enclosure by absorbing the EM energy and dissipating the EM energy as heat within the multi-layer structure.

The transmission coefficient of the multi-layer structure is very low; meaning that the majority of the EM energy does not leave a region enclosed by the multi-layer structure. For example, a transmitter can have its inner chassis walls coated with the multi-layer structure of the present invention.

The multi-layer structure is formed by stacking various layers of dielectric, conductive, and/or polymer materials together. The impedances of the stacked materials are selected to maximize absorption of the spurious EM energy. The effective impedance of the multi-layer structure is changed by selecting different combinations of materials to change the effective properties of the shielding structure.

Further background concerning materials to be used in connection with the present invention can be found in a number of references, including U.S. Pat. No. 4,948,922 to Varandan et al. titled, "Electromagnetic Shielding and Absorptive Materials," U.S. Pat. No. 4,371,742 to Manly titled, "EMI-Suppression From Transmission Lines" and U.S. Pat. No. 4,889,750 to Wiley titled, "Conductive Coatings and Foams for Anti-static Protection, Energy Absorption, and Electromagnetic Compatibility." These patents are incorporated herein by reference.

Figure 1:
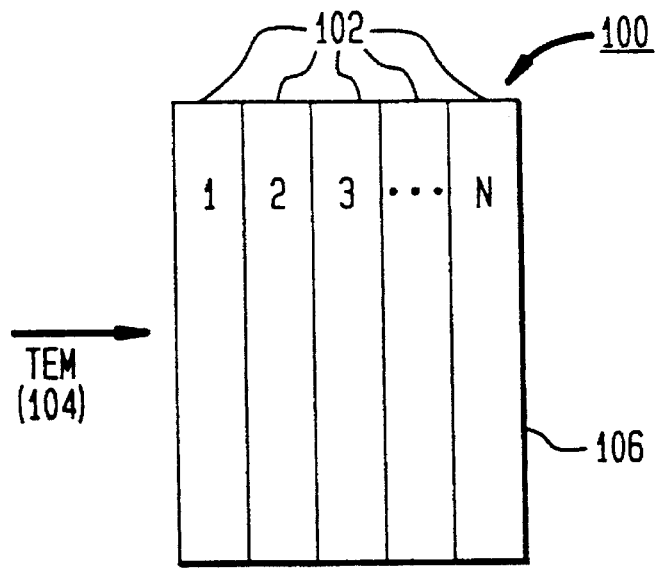
FIG. 1 shows a diagrammatic cross-sectional representation of a multi-layer structure 100 according to the present invention.

FIG. 1 shows a diagrammatic cross-sectional representation of a multi-layer structure 100. The multi-layer structure 100 comprises 1 through N layers 102 of material. A transverse electromagnetic wave (TEM) 104 impinges the multi-layer structure 100 and is substantially absorbed into and dissipated within the layers 102. According to the present invention, the EM energy 104 is absorbed and dissipated prior to reaching an outer surface 106 of layer N. The multi-layer structure 100 can be formed in a planar shape or it can be molded to fit curves surfaces or the like. The multi-layer structure 100 can be used in place of, or to supplement conventional EM shields.

Figure 2:
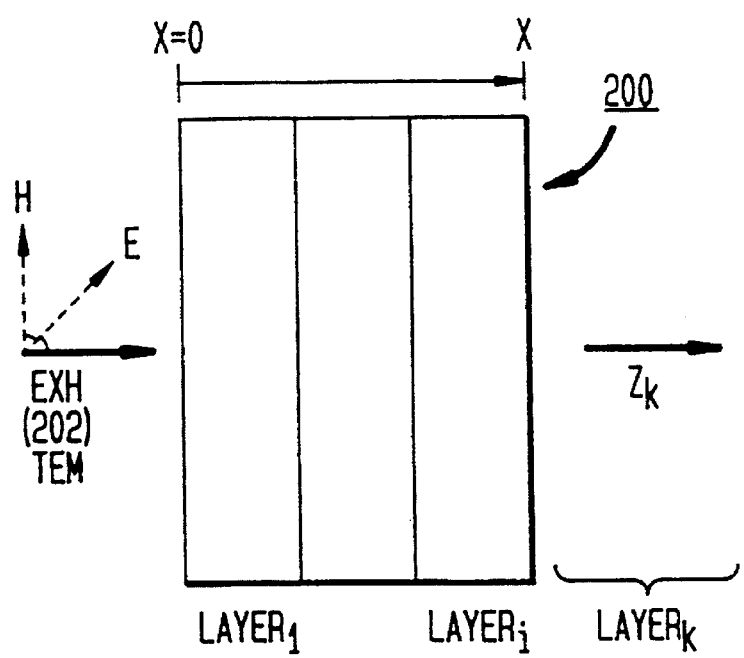
FIG. 2 shows a further multi-layer structure 200.

FIG. 2 shows a further multi-layer structure 200 labeled to aid in the following description of its electromagnetic characteristics, in accordance with the present invention. A TEM wave 202 is shown traveling through free-space and impinging the multi-layer structure 200. Electric field intensity E and magnetic field intensity H are also shown. The cross product E×H is the instantaneous power density, measured in watts per square meter (W/m$^2$).

The multi-layer structure 200 has multi-layers comprising layer$_1$ through layer$_i$ and a total thickness x. Layers 1 and i have the following electrical and/or magnetic properties: thickness $(d_1, d_i)$; permittivity $(\epsilon_1, \epsilon_i)$, propagation constant $(\gamma_1, \gamma_i)$, permeability $(\mu_1, \mu_i)$ and conductivity $(\sigma_1, \sigma_i)$. A layer$_k$ represents structural material on a side of the multi-layer structure 200 opposite to the side in which the TEM wave 202 entered.

Impedance of last layer K is given by:

$$Z_{w_{k-1}} = Z_{k-1} \left[ \frac{[Z_k + Z_{k-1} \tanh(\gamma_{k-1}(w)d_{k-1})]}{[Z_{k-1} + Z_k \tanh(\gamma_{k-1}(w)d_{k-1})]} \right]$$

and:

$$Z_{w_1} = Z_1 \left[ \frac{[Z_{w_2} + Z_1 \tanh(\gamma_1(w)d_1)]}{[Z_1 + Z_{w_2} \tanh(\gamma_1(w)d_1)]} \right]$$

$$Z_{w_2} = Z_1 \left[ \frac{[Z_{w_3} + Z_2 \tanh(\gamma_2(w)d_2)]}{[Z_2 + Z_{w_3} \tanh(\gamma_2(w)d_2)]} \right]$$

et cetera, where:

$Z_{w_k}$ is wave impedance at the $k^{th}$ boundary. Also, the reflection coefficient is:

$$\Gamma = \frac{Z_{w_1} - Z_0}{Z_{w_1} + Z_0}$$

at the first layer of TEM wave incidence.

Further mathematical theory for multi-layer structures is described by Paul A. Chatterton and Michael A. Houlden in a book titled, *EMC Electromagnetic Theory to Practical Design*, (John Wiley & Sons, West Sussex, England, pp. 73–97, 1992).

The material type and thickness for the layers to achieve effective absorption of the TEM wave are wavelength and application dependent. The thickness is dependent on the electrical and magnetic properties of the selected materials. According to the present invention, it is desirable, but not necessary, that the second and further layers have impedances that gradually change from layer to layer. Based on the specific application, selection of specific materials and thicknesses would be apparent to a person skilled in the relevant art through routine computer modeling and experimentation. Example material types include, but are not limited to dielectrics, conductors and polymers. Dielectric and polymer materials can be impregnated with various metals to adjust their electromagnetic properties, as described by the above-referenced patents, and as would be apparent to a person skilled in the relevant art.

The first boundary presented to the incident wave is critical, as it must "entice" the TEM wave to enter its boundary. Thus, it is desirable that the first layer be "electromagnetically transparent" to the wavelength(s) to be absorbed by the multi-layer structure. Once inside, a gradual transition of material properties (conduction, etc.) cause the TEM energy to be dissipated within the multi-layer structure in the form of joule heating. For example, the first layer preferably has an impedance of 377 Ω (close to that of free-space). This will drastically reduce the required layer thickness to make the present invention practical at "lower" RF frequencies.

In a further embodiment of the present invention, the shape of the first layer material can be optimally textured to reduce angular reflection of the incident TEM wave as well as to provide increased surface area for energy dissipation and an initial impedance to the wavefront. The first layer, or the first layer and any number of subsequent layers, can comprise "points" to produce better impedance matching and less "trauma" to incoming TEM waves. An example of this is shown in FIGS. 3–5.

Figure 3:
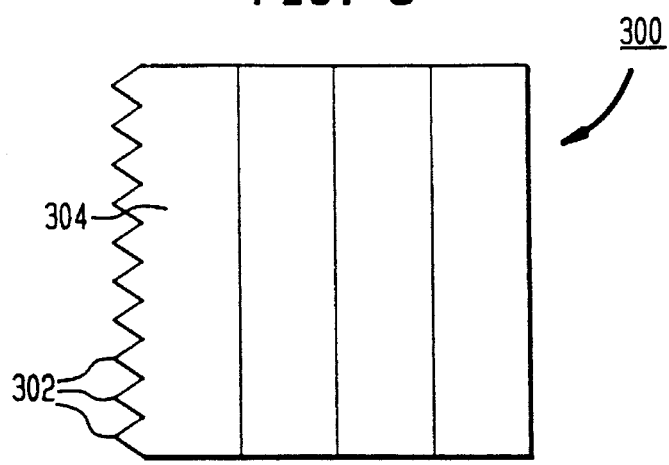
FIG. 3 shows a multi-layer structure 300 having points 302 formed of the first layer material 304 according to the present invention.

FIG. 3 shows a multi-layer structure 300 having points 302 formed of the first layer material 304. The points have dimensions optimized to minimize angular reflections of the energy at one or more specific wavelengths. In addition, an electromagnetically transparent smooth layer can be formed over the points 302 of the first layer.

Figure 4:
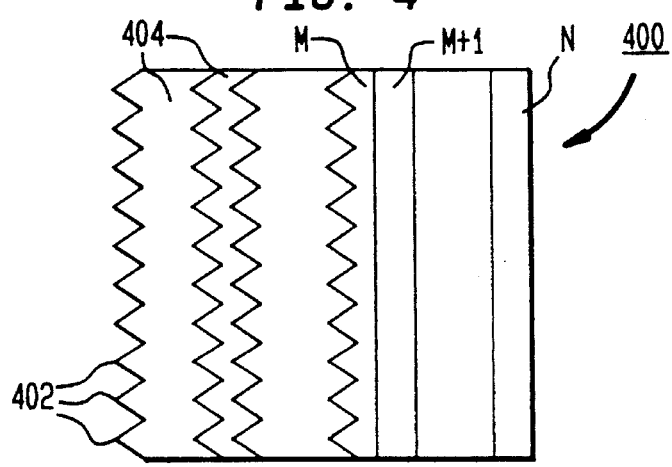
FIG. 4 shows a multi-layer structure 400 having points 402 formed of layers 404 according to the present invention.

FIG. 4 shows a multi-layer structure 400 having points 402 formed on the first M layers 404. Layers M+1 through N are not pointed in this embodiment.

Figure 5:
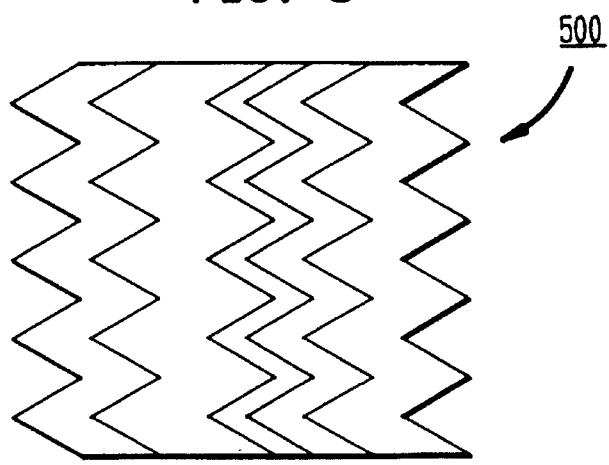
FIG. 5 shows a multi-layer structure 500 comprising a corrugated cross-section according to the present invention.

FIG. 5 shows a multi-layer structure 500 comprising a corrugated cross-section. Each layer of structure 500 is pointed in this embodiment. Many other texturing techniques and variations of these embodiments would be apparent to a person skilled in the relevant art to produce impedance matching and power dissipation.

Figure 6:
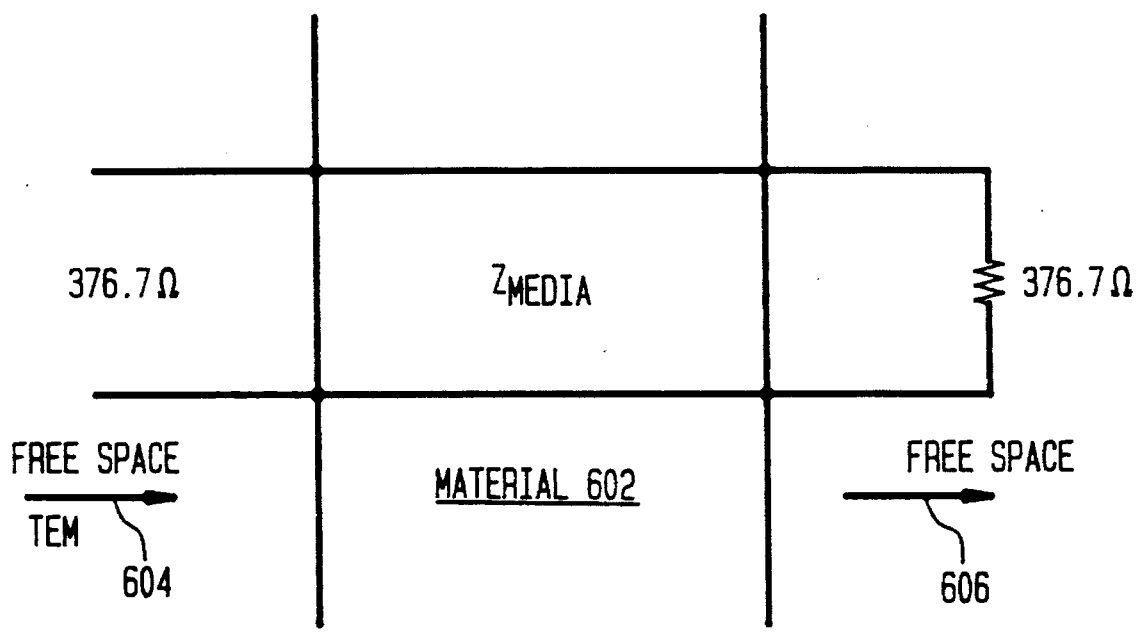
FIG. 6 shows an impedance circuit representation of a multi-layer structure according to the present invention.

Basic transmission line theory can be extended to the present invention of transmission through a medium or reflection. FIG. 6 shows an impedance circuit representation of a multi-layer structure. Material for absorption of reflection is shown generally at 602 and has an impedance $Z_{media}$. Free space and an incident TEM wave are shown at 604. Free space and a resultant EM wave transmitted through the material are shown at 606. The velocity in the media is:

$$V = \frac{c}{\epsilon_r^{1/2}}$$

and the wavelength in the media is $\lambda_M = V/F$ where angular frequency $\omega = 2\pi F$.

The intrinsic impedance of a single layer of media is:

$$Z_M = \frac{Z_0}{\epsilon_r^{1/2}}$$

The steady state transmission coefficient (τ) is given by: τ=ρ+1.

The impedance of all realizable materials is less than free space because μr>1, making the magnitude of the E field exiting the material less than the magnitude of the entering TEM wave.

It is preferred that any reflections at layer boundaries be absorbed so that no energy escapes the structure. In other words, if a portion of a TEM wave passing through layers 1–2 of a 3 layer structure, for example, is reflected back to the source at the second boundary (i.e, the boundary between layers 2 and 3), it must be absorbed by layers 1 and 2 before it is permitted to escape the 3-layer structure.

In a still further embodiment of the present invention, the effective amount of EM energy absorption of each layer gradually increases from layer$_1$ to layer$_i$ to achieve a smooth absorption transition within the structure. Alternatively, a single layer or plural layers having graded absorption can be used.

While various embodiments of the present invention have been described above, it should be understood that they have been presented by way of example, and not limitation. It will be apparent to persons skilled in the relevant art that various changes in form and detail may be made therein without departing from the spirit and scope of the invention. Thus, the present invention should not be limited by any of the above-described exemplary embodiments, but should be defined only in accordance with the following claims and their equivalents. All cited patent documents and publications in the above description are incorporated herein by reference.

What is claimed is:

1. A multi-layer structure for shielding electromagnetic energy in a data processing enclosure, comprising:

an electromagnetically transparent first layer formed of a first material having a first set of electromagnetic properties and a first impedance approximately equal to an impedance for free-space; and at least one further layer stacked behind said first layer and formed of at least one further material having a second set of electromagnetic properties and a second impedance, said second set of electromagnetic properties being different than said first set of electromagnetic properties and said first impedance being different from said second impedance, wherein said electromagnetically transparent first layer and said at least one further layer are selected to allow for a gradual absorption of the electromagnetic energy, whereby the gradual absorption of the electromagnetic energy allows for a gradual dissipation of the electromagnetic energy in the form of joule heating within the multi-layer structure thereby reducing reflection of the electromagnetic energy by the multi-layer structure.

2. The multi-layer structure of claim 1, wherein said electromagnetically transparent first layer has points.

3. The multi-layer structure of claim 2, wherein said points have dimensions configured to minimize angular reflections of the electromagnetic energy at a single wavelength.

4. The multi-layer structure of claim 2, wherein said points have dimensions configured to minimize angular reflections of the electromagnetic energy at a plurality of wavelengths.

5. The multi-layer structure of claim 2, wherein said first and said at least one further layer have a corrugated cross-section.

6. The multi-layer structure of claim 2, further comprising a still further layer of electromagnetically transparent material formed over said points.

7. The multi-layer structure of claim 5, further comprising a still further layer of electromagnetically transparent material formed over said points.

8. The multi-layer structure of claim 5, wherein said at least one further layer comprises a plurality of further layers having different corrugated cross-sections.

9. The multi-layer structure of claim 1, further comprising a plurality of still further layers stacked behind said at least one further layer and formed of still further materials having at least one further set of electromagnetic properties, wherein said at least one further set of electromagnetic properties is configured to absorb the electromagnetic energy and dissipate the electromagnetic energy as heat within the multi-layer structure to reduce reflection of the electromagnetic energy by the multi-layer structure.

10. The multi-layer structure of claim 9, wherein said further set of electromagnetic properties are configured to gradually absorb the electromagnetic energy and dissipate the electromagnetic energy as heat within the multi-layer structure to reduce reflection of the electromagnetic energy by the multi-layer structure.

11. The multi-layer structure of claim 6, wherein said still further layer of electromagnetically transparent material has a smooth outer surface.

12. The multi-layer structure of claim 7, wherein said still further layer of electromagnetically transparent material has a smooth outer surface.

* * * * *